(12) United States Patent
An

(10) Patent No.: US 10,396,100 B2
(45) Date of Patent: Aug. 27, 2019

(54) ARRAY SUBSTRATE, DISPLAY PANEL AND PIXEL PATCHING METHOD

(71) Applicant: Shenzhen China Star Optoelectronics Technology Co., Ltd., Shenzhen, Guangdong (CN)

(72) Inventor: Liyang An, Guangdong (CN)

(73) Assignee: Shenzhen China Star Optoelectronics Technology Co., Ltd, Shenzhen, Guangdong (CN)

( * ) Notice: Subject to any disclaimer, the term of this patent is extended or adjusted under 35 U.S.C. 154(b) by 0 days.

(21) Appl. No.: 15/745,127

(22) PCT Filed: Nov. 8, 2017

(86) PCT No.: PCT/CN2017/109992
§ 371 (c)(1),
(2) Date: Jan. 15, 2018

(87) PCT Pub. No.: WO2019/056521
PCT Pub. Date: Mar. 28, 2019

(65) Prior Publication Data
US 2019/0088683 A1 Mar. 21, 2019

(51) Int. Cl.
*H01L 27/12* (2006.01)
*G02F 1/1362* (2006.01)
*G02F 1/1368* (2006.01)

(52) U.S. Cl.
CPC .......... *H01L 27/124* (2013.01); *G02F 1/1368* (2013.01); *G02F 1/136213* (2013.01);
(Continued)

(58) Field of Classification Search
CPC ............. H01L 27/124; G02F 1/136213; G02F 1/136286; G02F 1/1368; G02F 1/136259; G02F 2201/121; G02F 2201/123
See application file for complete search history.

(56) References Cited

U.S. PATENT DOCUMENTS 5,260,818 A * 11/1993 Wu ...................... G02F 1/13624
349/144
2004/0125332 A1* 7/2004 Choi .................. G02F 1/136259
349/190
(Continued)

FOREIGN PATENT DOCUMENTS

CN 1740885 A 3/2006
CN 101424792 A 5/2009
(Continued)

*Primary Examiner* — Steven H Loke
*Assistant Examiner* — Juanita B Rhodes
(74) *Attorney, Agent, or Firm* — Andrew C. Cheng

(57) ABSTRACT

The present application provides an array substrate, which comprises a plurality of gate lines, a plurality of data lines, a plurality of thin film transistors, a plurality of pixel electrodes, and a plurality of conductive members. In each of the pixel regions, a control terminal of the TFT is electrically connected with the gate line, an input terminal of the TFT is electrically connected with the data line, and an output terminal of the TFT is electrically connected with the pixel electrode. The output terminal comprises a body, and a first contact and a second contact which are connected with the body. The first contact and one of the conductive members extending into the pixel region are overlapping-disposed and insulated from each other. The second contact and another of the conductive members extending into the pixel region are overlapping-disposed and insulated from each other.

18 Claims, 7 Drawing Sheets

(52) U.S. Cl.
CPC .. *G02F 1/136259* (2013.01); *G02F 1/136286* (2013.01); *G02F 2201/121* (2013.01); *G02F 2201/123* (2013.01)

(56) References Cited

U.S. PATENT DOCUMENTS

| | | | | |
|---|---|---|---|---|
| 2007/0008242 | A1* | 1/2007 | Mori | G02F 1/134309 345/60 |
| 2007/0091241 | A1 | 4/2007 | Lin et al. | |
| 2008/0036936 | A1* | 2/2008 | Kawamura | G02F 1/13624 349/54 |
| 2008/0158465 | A1* | 7/2008 | Choi | G02F 1/136259 349/54 |
| 2013/0335662 | A1* | 12/2013 | Chang | G02F 1/1309 349/43 |
| 2016/0216578 | A1* | 7/2016 | Lee | G02F 1/1362 |
| 2016/0291435 | A1* | 10/2016 | Que | G02F 1/134363 |
| 2017/0205673 | A1* | 7/2017 | Wang | G02F 1/13306 |

FOREIGN PATENT DOCUMENTS

| | | | |
|---|---|---|---|
| CN | 101533844 | A | 9/2009 |
| CN | 102707467 | A | 10/2012 |
| JP | 2002278476 | A | 9/2002 |

* cited by examiner

ARRAY SUBSTRATE, DISPLAY PANEL AND PIXEL PATCHING METHOD

BACKGROUND OF THE APPLICATION

This application claims the priority of an application No. 201710858164.1 filed on Sep. 20, 2017, entitled "ARRAY SUBSTRATE, DISPLAY PANEL AND PIXEL PATCHING METHOD", the contents of which are hereby incorporated by reference.

FIELD OF APPLICATION

The present disclosure relates to the field of liquid crystal display technology, and particularly to an array substrate, a display panel and a pixel patching method.

DESCRIPTION OF PRIOR ART

With development of display technology, flat panel display devices such as liquid crystal displays (LCDs) are widely used in mobile phones, televisions, personal digital assistants (PDAs), digital cameras, laptops, desktop computers and other consumer electronics products, because of their advantages of high image quality, low power consumption, thin body and wide application range, and have become the mainstream of display devices.

Most liquid crystal display devices on the market are backlight type LCDs, which include a LCD panel and a backlight module. Making an array substrate of a LCD panel is a relative complicated process; a pattern is formed on a glass substrate by continuously repeating evaporation, exposure, development and etching for different film layers on the glass substrate. Different conductors, semiconductors and insulators form circuit components, the electrical signal is transformed into the direction change of the liquid crystal molecules, and ultimately the picture we want is displayed.

The array substrate is generally easily has problems than the color filter substrate, due to the more processes required and the complexity and many processes has high demands on the environment. There are usually particles, broken lines, short lines, etc. that can cause problems with the array. Generally, after the array substrate is manufactured, we inspect the array substrate to check if the performance of the pixel is normal. If the display problem of individual pixels (such as the loss of the performance of the thin film transistor) is patched immediately, the waste of subsequent targets can be avoided. Patch on pixels can greatly improve product yield, especially large-size high-resolution (PPI) products. For broken lines, short lines, and etc. of pixels, the usual patching method is to perform a dark point repair to the pixel.

Since the repaired liquid crystal display panel always has a dark point in one position, the sensory experience of the client when viewed will be affected. The problem caused by this dark point repair will be more obvious when two consecutive pixels are performed with dark point repair.

SUMMARY OF THE APPLICATION

The technical problem to be solved by the present invention is to provide an array substrate, a display panel and a pixel patching method capable of improving sensory experience after patch.

In order to achieve the above object, the embodiments of the present invention adopt the following technical proposals:

In one aspect, an array substrate is provided, which comprises a plurality of gate lines, a plurality of data lines, a plurality of thin film transistors (TFTs), a plurality of pixel electrodes, and a plurality of conductive members. The plurality of data lines and the plurality of gate lines are cross-arranged to enclose a plurality of pixel regions. The plurality of conductive members are insulated from each other, and each of the conductive members corresponds to two adjacent ones of the pixel regions.

In each of the pixel regions, a control terminal of the TFT is electrically connected with the gate line, an input terminal of the TFT is electrically connected with the data line, and an output terminal of the TFT is electrically connected with the pixel electrode. The output terminal comprises a body, and a first contact and a second contact which are connected with the body. The first contact and one of the conductive members extending into the pixel region are overlapping-disposed and insulated from each other. The second contact and another of the conductive members extending into the pixel region are overlapping-disposed and insulated from each other.

Wherein the conductive members are strip-shaped, and an extending direction of the conductive members are perpendicular to an extending direction of the data lines or the gate lines.

Wherein the array substrate further comprises a common electrode line insulated from the pixel electrode to form a first storage capacitor, the common electrode line and the body are insulated from each other to form a second storage capacitor.

Wherein the conductive members and the common electrode line are disposed in the same layer.

Wherein the body, the first contact, and the second contact are the same material and disposed in the same layer, the body electrically connected with the pixel electrode.

Wherein the output terminal further comprises a second wiring and a third wiring. The second wiring is connected between the first contact and the body. The third wiring is connected between the second contact and the body.

Wherein the second wiring is stripe-shaped, the first contact is rectangular and in an extending direction of the second wiring, a width of the first contact is greater than or equal to a width of the second wiring.

In another aspect, a display panel is further provided, which comprises the above array substrate.

In still another aspect, a pixel patching method is further provided, which is applied in the above array substrate. The plurality of pixel regions comprise a first pixel region and a second pixel region, which are adjacent to each other. The plurality of conductive members comprises a first conductive member corresponding to the first pixel region and the second pixel region. The second contact in the first pixel region and the first conductive member are overlapping-disposed with and insulated from each other. The first contact in the second pixel region and the first conductive member are overlapping-disposed and insulated from each other. The pixel patching method comprises:

When the first pixel region displays abnormally and the second pixel region displays normally, the data line and the input terminal in the first pixel region are disconnected, the second contact and the first conductive member in the first pixel region are conducted, and the first contact and the first conductive member in the second pixel region are conducted.

Or, when the second pixel region displays abnormally and the first pixel region displays normally, the data line and the input terminal in the second pixel region are disconnected, the second contact and the first conductive member in the first pixel region are conducted, and the first contact and the first conductive member in the second pixel region are conducted.

Wherein the plurality of pixel regions further comprise a third pixel region and a fourth pixel region. The plurality of conductive members further comprise a second conductive member and a third conductive member. The third pixel region is adjacent-disposed with the second pixel region. The second conductive member corresponds to the second pixel region and the third pixel region. The fourth pixel region is adjacent-disposed with the first pixel region. The third conductive member corresponds to the first pixel region and the fourth pixel region. The pixel repairing method further comprises:

When the first pixel region and the second pixel region display abnormally and the third pixel region and the fourth pixel region display normally, the data line and the input terminal in the first pixel region are disconnected, the first contact and the third conductive member in the first pixel region are conducted, and the second contact and the third conductive member in the fourth pixel region are conducted.

And, the data line and the input terminal in the second pixel region are disconnected, the second contact and the second conductive member in the second pixel region are conducted, and the first contact and the second conductive member in the third pixel region are conducted.

Compared with the conventional art, the present invention has the following beneficial effects:

In the array substrate in the embodiment of the present invention, when a certain pixel region displays abnormally and one adjacent pixel region displays normally, the data line and the input terminal of the abnormal pixel region are disconnected, the first contact (or the second contact) and the conductive member (the conductive member corresponds to the abnormal pixel region and the adjacent normal pixel region) are conducted, the second contact (or the first contact) and the same conductive member of the adjacent normal pixel region are conducted, so that a potential of the pixel electrode of the abnormal pixel region is the same as a potential of the pixel electrode of the adjacent normal pixel region, the abnormal pixel region can display the image of the adjacent normal pixel region, thereby improving the sensory experience after the pixel is repaired, furthermore, waste of subsequent target can be avoided, and the product yield is improved.

BRIEF DESCRIPTION OF THE DRAWINGS

In order to describe the technical solutions in the embodiments of the present application or in the conventional art more clearly, the accompanying drawings required for describing the embodiments or the conventional art are briefly introduced. Apparently, the accompanying drawings in the following description only show some embodiments of the present application. For those skilled in the art, other drawings may be obtained based on these drawings without any creative work.

DETAILED DESCRIPTION OF THE PREFERRED EMBODIMENTS

Figure 1:
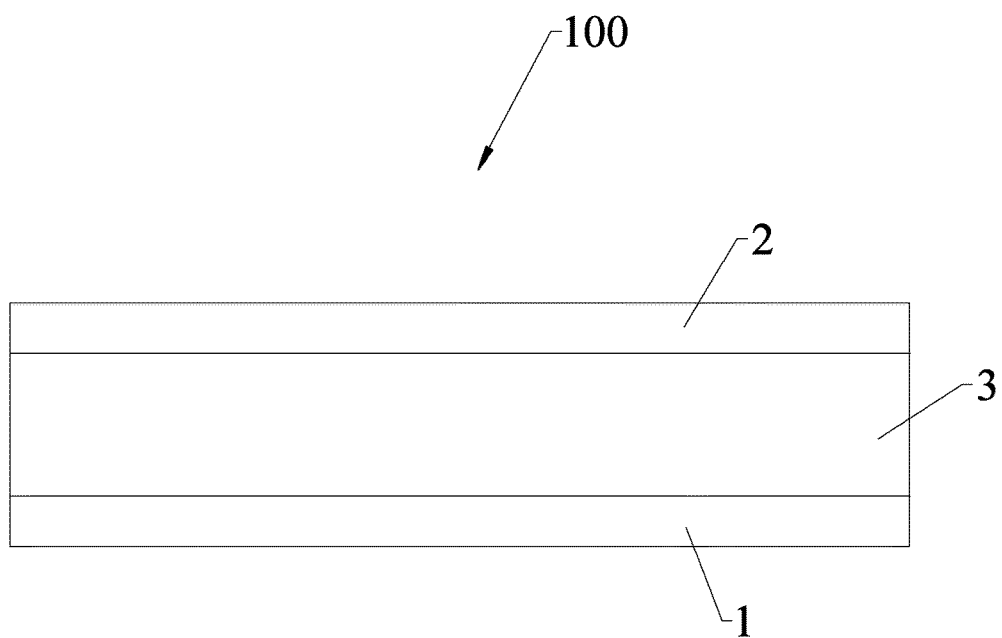
FIG. 1 is a structural illustrative diagram of a display panel according to an embodiment of the present application.
Figure 2:
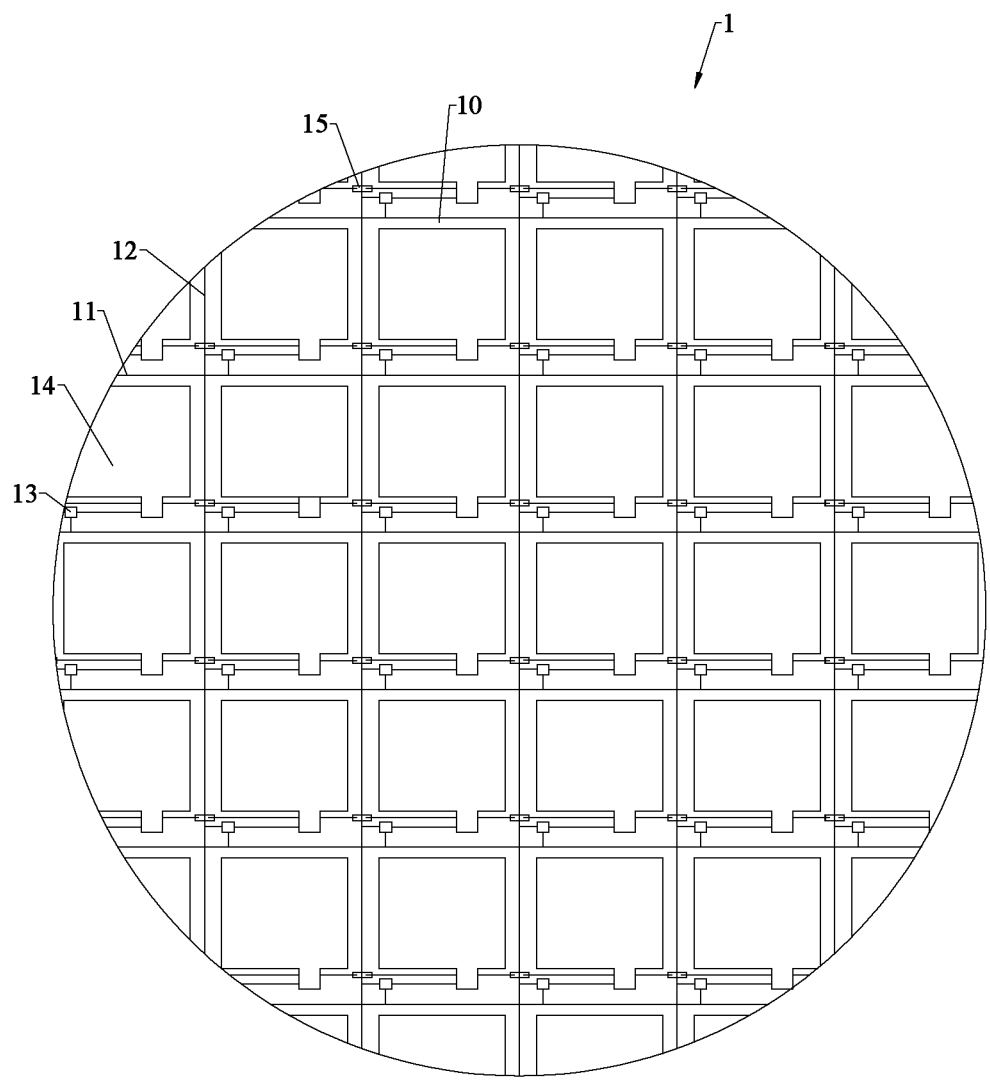
FIG. 2 is a structural illustrative diagram of an array substrate of the display panel shown in FIG. 1.

The technical solution in the embodiments of the present invention will be clearly and completely described below with reference to the accompanying drawings in the embodiments of the present invention. Apparently, the described embodiments are merely some but not all of the embodiments of the present invention. All other embodiments obtained by persons of ordinary skill in the art based on the embodiments of the present invention without creative efforts shall fall within the protection scope of the present invention.

Please refer to FIG. 1 to FIG. 6, an embodiment of the present invention provides a display panel 100. The display panel 100 comprises an array substrate 1. The display panel 100 is applicable to various display devices. The display panel 100 further comprises a color filter (CF) substrate 2 disposed opposite to the array substrate 1, and a liquid crystal (LC) layer 3 disposed between the array substrate 1 and the CF substrate 2.

The array substrate 1 comprises a plurality of gate lines 11, a plurality of data lines 12, a plurality of thin film transistors (TFTs) 13, a plurality of pixel electrodes 14, and a plurality of conductive members 15. The plurality of data lines 12 and the plurality of gate lines 11 are cross-arranged to enclose a plurality of pixel regions 10. Each of the pixel regions 10 correspondingly has the TFT 13 and the pixel electrode 14 therein. In an embodiment, the plurality of TFTs 13 and the plurality of pixel electrodes 14 are arranged in one-to-one within the plurality of pixel regions 10. The plurality of conductive members 15 are insulated from each other, and each of the conductive members 15 corresponds to two adjacent pixel regions 10. The plurality of conductive members 15 are arranged in an array. The plurality of conductive members 15 and the plurality of pixel regions 10 have the same array arrangement.

In each of the pixel regions 10, a control terminal 13*a* (for example, a gate electrode) of the TFT 13 is electrically connected with the gate line 11, an input terminal 13*b* (for example, a drain electrode or a source electrode) of the TFT 13 is electrically connected with the data line 12, and an output terminal 13*c* (for example, a source electrode or a drain electrode) of the TFT 13 is electrically connected with the pixel electrode 14. The output terminal 13*c* comprises a body 141 and a first contact 142 and a second contact 143 connected with the body 141. The first contact 142 and one of the conductive members 15 extending into the pixel region 10 are overlapping-disposed and insulated from each other. The second contact 143 and another of the conductive members 15 extending into the pixel region 10 are overlapping-disposed and insulated from each other.

Figure 6:
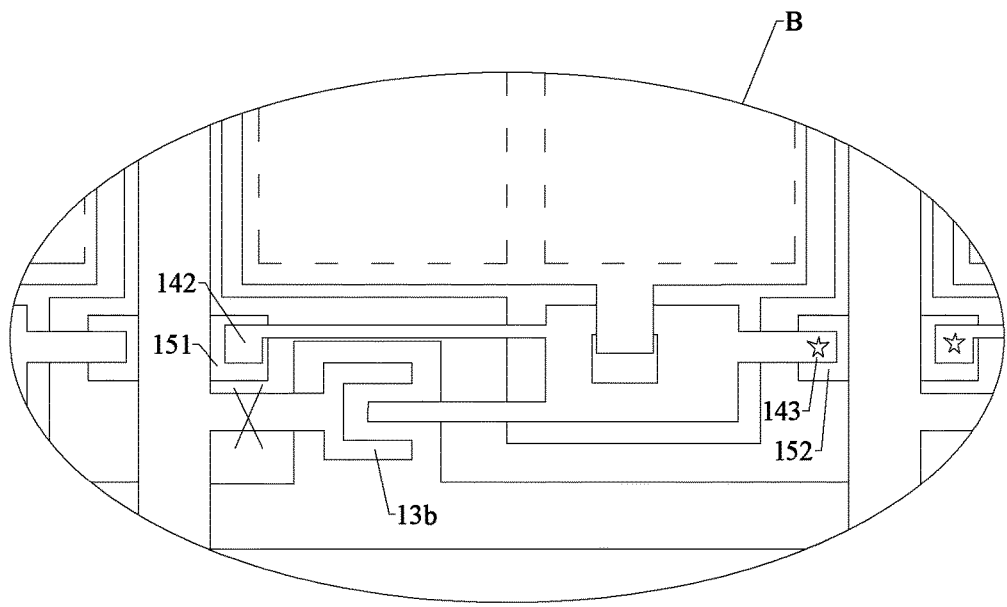
FIG. 6 is an enlarged drawing of a structure of B portion in FIG. 5.

As shown in FIG. 6, the plurality of pixel regions 10 comprise a first pixel region 101 and a second pixel region 102, which are adjacent to each other. The plurality of conductive members 15 comprises a first conductive member 151 corresponding to the first pixel region 101 and the second pixel region 102. The plurality of pixel regions 10 further comprise a third pixel region 103 adjacent-disposed with the second pixel region 102. The plurality of conductive members 15 further comprise a second conductive member 152 corresponding to the second pixel region 102 and the third pixel region 103. In the second pixel region 102, the first contact 142 of the output terminal 13c and the first conductive member 151 are overlapping-disposed and insulated from each other, the second contact 143 of the output terminal 13c and the second conductive member 152 are overlapping-disposed and insulated from each other In the embodiment, when a certain pixel region 10 displays abnormally and one adjacent pixel region 10 displays normally, the data line 12 and the input terminal 13b of the abnormal pixel region 10 are disconnected, the first contact 142 (or the second contact 143) and the conductive member 15 (the conductive member 15 corresponds to the abnormal pixel region 10 and the adjacent normal pixel region 10) are conducted, the second contact 143 (or the first contact 142) and the same conductive member 15 of the adjacent normal pixel region 10 are conducted, so that a potential of the pixel electrode 14 of the abnormal pixel region 10 is the same as a potential of the pixel electrode 14 of the adjacent normal pixel region 10, the abnormal pixel region 10 can display the image of the adjacent normal pixel region 10, thereby improving the sensory experience after the pixel is repaired, furthermore, waste of subsequent target can be avoided, and the product yield is improved.

Figure 5:
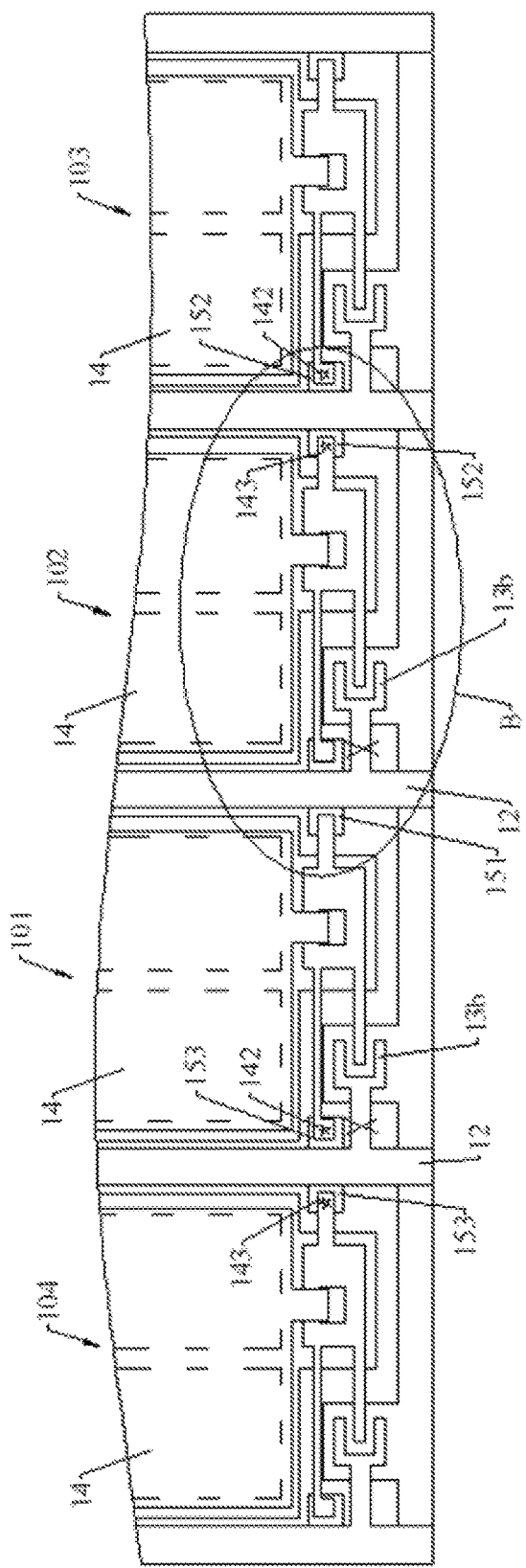
FIG. 5 is a first schematic diagram of a pixel patching method according to an embodiment of the present invention.

It can be understood that, in the embodiment of the present invention, the positions of the first contact 142 and the second contact 143 are adjustable. In the embodiment of the present invention, the positions of the first contact 142 and the second contact 143 will be described as an example. In the embodiment of the present invention, the first pixel region 101 and the second pixel region 102 may be located on two sides of one of the data lines 12 and arranged along an extending direction of the gate line 11 (as shown in FIG. 5, the conductive member 15 is cross-disposed on the data line 12). The first pixel region 101 and the second pixel region 102 may also be located on two sides of one of the gate lines 11 and are arranged along an extending direction of the data line 12 (in this case, the conductive member 15 is cross-disposed on the gate line 11). The plurality of conductive members 15 and the plurality of pixel regions 10 have the same array arrangement, that is, the arrangement density and arrangement rule of the plurality of conductive members 15 and the plurality of pixel regions 10 are the same with each other.

Selectively, the input terminal 13b comprises an input terminal 132 and a first wiring 121. The first wiring 121 is electrically connected with the input terminal 132 and the data line 12. When an abnormality occurs in a certain pixel regions 10, the first wiring 121 may be cut off by laser to disconnect the input terminal 132 from the data line 12. The output terminal 13c further comprises an output terminal 133, which is connected with the body 141.

Selectively, the conductive members 15 are strip-shaped, and an extending direction of the conductive members 15 are perpendicular to an extending direction of the data lines 12 or the gate lines 11. At this time, the conductive member 15 can successfully cross the data line 12 or the gate line 11 with only a small area to be arranged in two adjacent pixel regions 10 at the same time. The areas of the conductive members 15 located in the two adjacent pixel regions 10 may be the same or different, which can successfully achieve the overlapping arrangement of the first contacts 142 or the second contacts 143.

Figure 3:
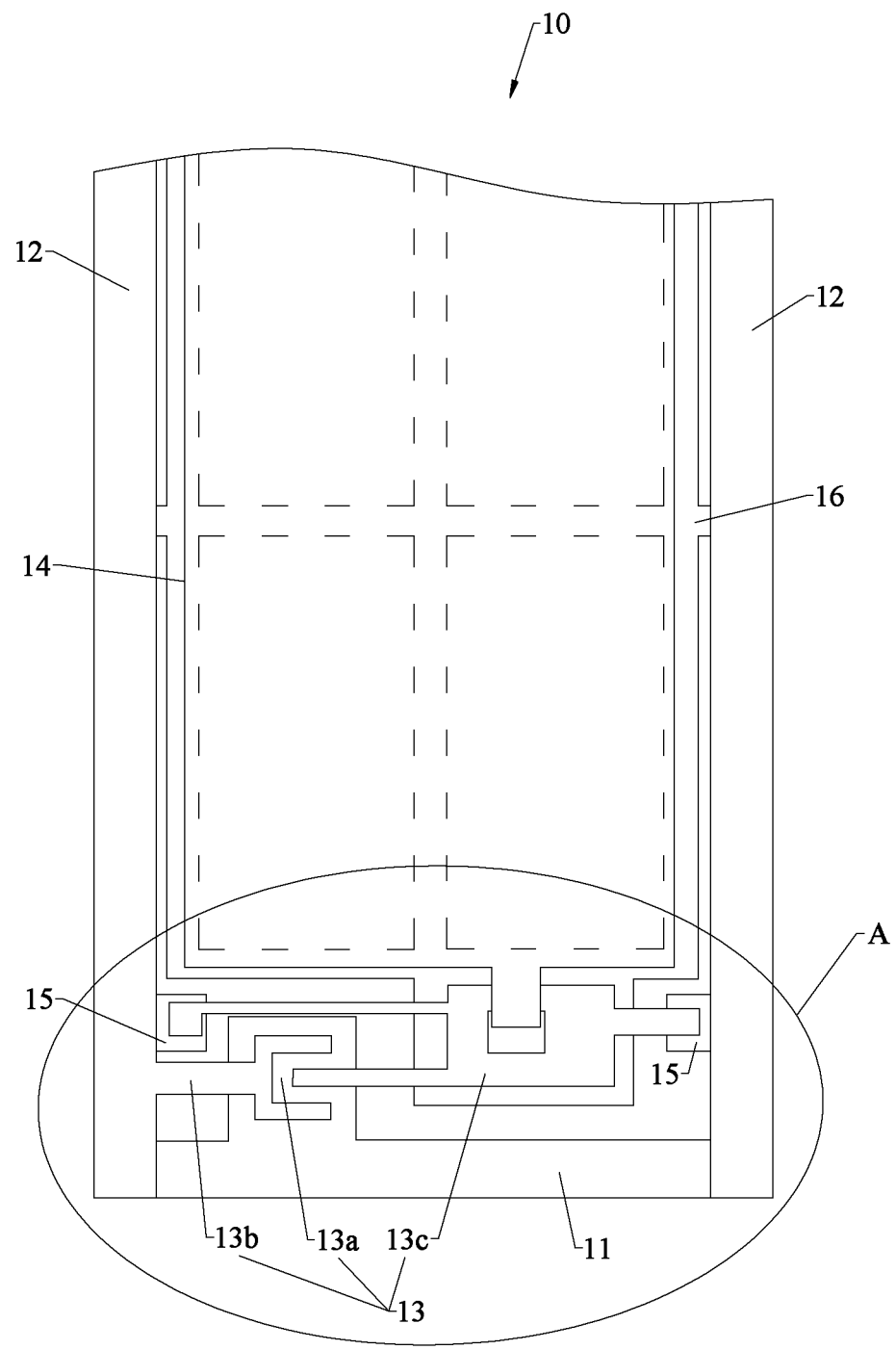
FIG. 3 is a structural illustrative diagram of one pixel region of the array substrate shown in FIG. 2.
Figure 4:
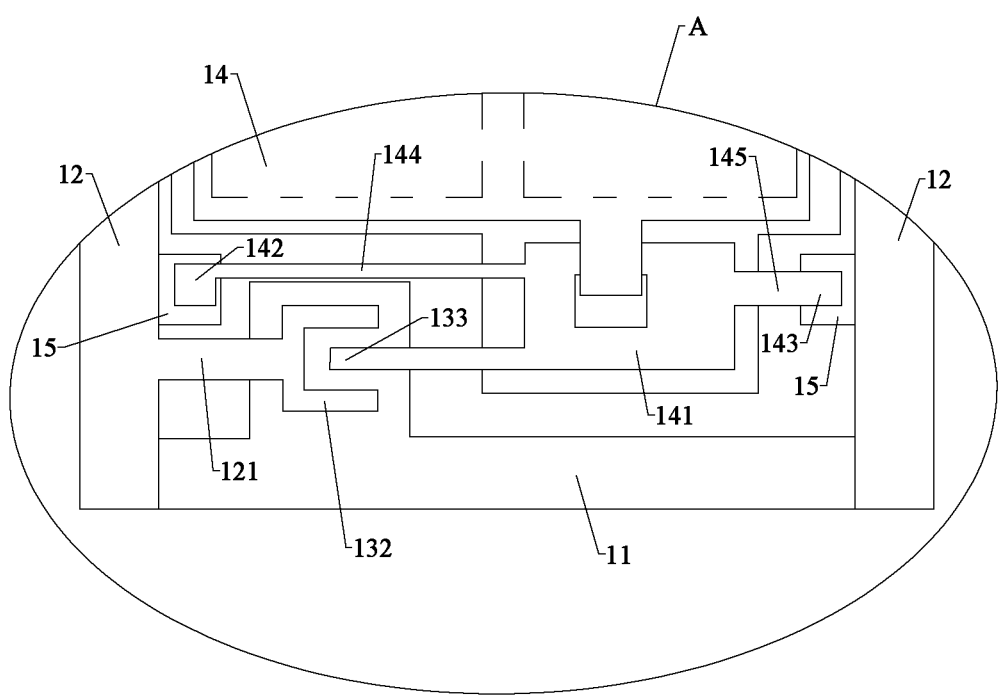
FIG. 4 is an enlarged drawing of a structure of A portion in FIG. 3.

As a selective embodiment, as shown in FIG. 3, the array substrate 1 further comprises a common electrode line 16 insulated from the pixel electrode 14 to form a first storage capacitor (not shown in FIG.), the common electrode line 16 and the body 141 of the output terminal 13c are insulated from each other to form a second storage capacitor (not shown in FIG.). Insulation can be achieved with an insulating layer made of silicon oxynitride (SiNx/SOx) material. The array substrate 1 comprises a base substrate (not shown in FIG.), and the common electrode line 16 is disposed between the pixel electrode 14 and the base substrate. The arrangement of the dual storage capacitor is beneficial to improve the performance of the array substrate 1, so that the display quality of the display panel 100 applied with the array substrate 1 is high.

Selectively, the conductive members 15 and the common electrode line 16 are disposed in the same layer. The conductive members 15 and the common electrode line 16 are the same material and disposed in the same layer, which can simplify the manufacturing process of the array substrate 1, so as to lower the cost of the array substrate 1.

Please refer to FIG. 1 to FIG. 6, as one selective embodiment, the body 141, the first contact 142, and the second contact 143 are the same material and disposed in the same layer. The preparation of the output terminal 13c can be completed by one litho process, which can simplify the manufacturing process of the output terminal 13c, so as to lower the cost of the array substrate 1. The body 141 electrically connected with the pixel electrode 14.

Selectively, the output terminal 13c further comprises a second wiring 144 and a third wiring 145. The second wiring 144 is connected between the first contact 142 and the body 141. The third wiring 145 is connected between the second contact 143 and the body 141.

Selectively, the second wiring 144 is stripe-shaped, the first contact 142 is rectangular and in an extending direction of the second wiring 144. A width of the first contact 142 is greater than or equal to a width of the second wiring 144. The first contact 142 has a relatively large area, enabling reliable electrical connection with the conductive member 15 when needed.

The third wiring 145 is stripe-shaped, the second contact 143 is rectangular and in an extending direction of the third wiring 145. A width of the second contact 143 is greater than or equal to a width of the third wiring 145. The second contact 143 has a relatively large area, enabling reliable electrical connection with the conductive member 15 when needed.

The first contact 142 and/or the second contact 143 may also be circular, oval, or the like.

Please refer to FIG. 1 to FIG. 8, an embodiment of the present invention further provides a pixel patching method, which applied in the array substrate 1 of the above embodiments. The plurality of pixel regions 10 of the array substrate 1 comprise a first pixel region 101 and a second pixel region 102, which are adjacent to each other. The plurality of conductive members 15 comprises a first conductive member 151 corresponding to the first pixel region 101 and the second pixel region 102. The second contact 143 in the first pixel region 101 and the first conductive member 151 are overlapping-disposed and insulated from each other, the first contact in the second pixel region and the first conductive member are overlapping-disposed and insulated from each other.

Figure 7:
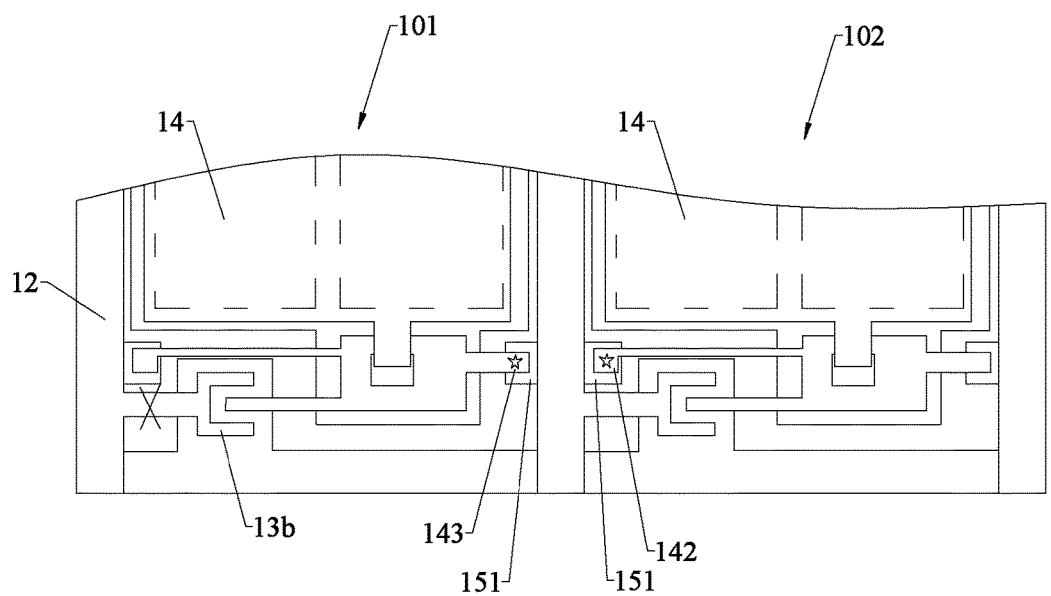
FIG. 7 is a second schematic diagram of a pixel patching method according to an embodiment of the present invention.

The pixel patching method comprises:

As shown in FIG. 7, when the first pixel region 101 displays abnormally and the second pixel region 102 displays normally, the data line 12 and the input terminal 13b in the first pixel region 101 are disconnected, the second contact 143 and the first conductive member 151 in the first pixel region 101 are conducted, and the first contact 142 and the first conductive member 151 in the second pixel region 102 are conducted.

Figure 8:
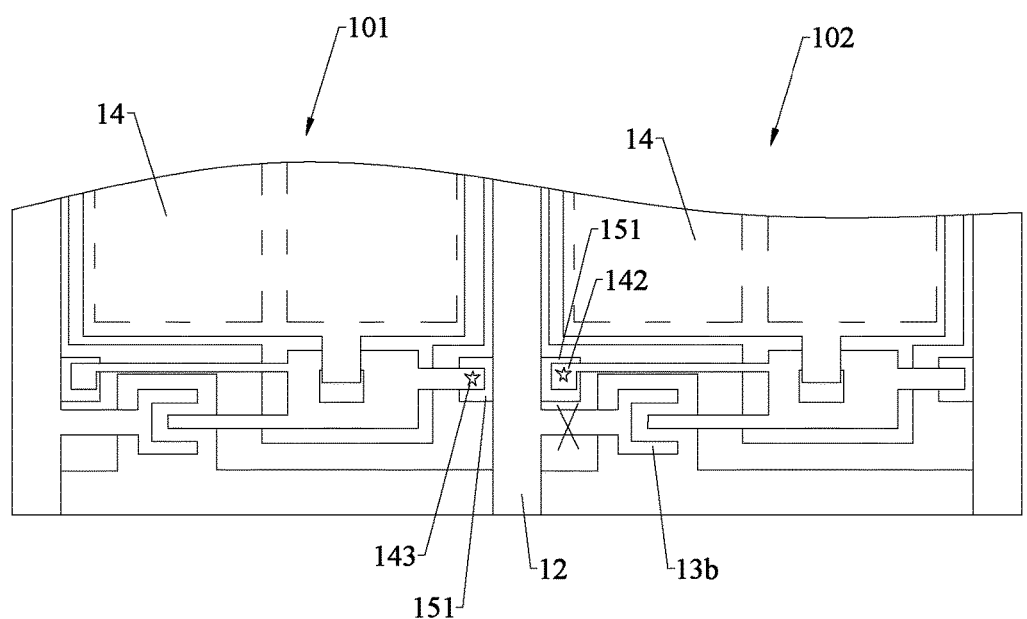
FIG. 8 is a third schematic diagram of a pixel patching method according to an embodiment of the present invention.

Or, as shown in FIG. 8, when the second pixel region 102 displays abnormally and the first pixel region 101 displays normally, the data line 12 and the input terminal 13b in the second pixel region 102 are disconnected, the second contact 143 and the first conductive member 151 in the first pixel region 101 are conducted, and the first contact 142 and the first conductive member 151 in the second pixel region 102 are conducted.

In the embodiment, a potential of the pixel electrode 14 in the first pixel region 101 is the same as a potential of the pixel electrode 14 of the second pixel region 102, the first pixel region 101 can display the image of the second pixel region 102, thereby improving the sensory experience after the pixel is repaired, furthermore, waste of subsequent target can be avoided, and the product yield is improved.

It is understood that the second contact 143 in the first pixel region 101 and the first conductive member 151 in the first pixel region 101 are conducted with each other, by breaking through from the second contact 143 in the first pixel region 101 to the first conductive member 151 in the first pixel region 101. The first contact 142 in the second pixel region 102 and the first conductive member 151 in the second pixel region 102 are conducted with each other, by breaking through from the first contact 142 in the second pixel region 102 to the first conductive member 151 in the second pixel region 102.

As a selective embodiment, please refer to FIG. 1 to FIG. 6, the plurality of pixel regions 10 of the array substrate 1 further comprise a third pixel region 103 and a fourth pixel region 104. The plurality of conductive members 15 further comprise a second conductive member 152 and a third conductive member 153. The third pixel region 103 is adjacent-disposed with the second pixel region 102. The second conductive member 152 corresponds to the second pixel region 102 and the third pixel region 103. The fourth pixel region 104 is adjacent-disposed with the first pixel region 101. The third conductive member 153 corresponds to the first pixel region 101 and the fourth pixel region 104.

The pixel repairing method further comprises:

As shown in FIG. 6, when the first pixel region 101 and the second pixel region 102 display abnormally and the third pixel region 103 and the fourth pixel region 104 display normally, the data line 12 and the input terminal 13b in the first pixel region 101 are disconnected, the first contact 142 and the third conductive member 153 in the first pixel region 101 are conducted, and the second contact 143 and the third conductive member 153 in the fourth pixel region 104 are conducted. And, the data line 12 and the input terminal 13b in the second pixel region 102 are disconnected, the second contact 143 and the second conductive member 152 in the second pixel region 102 are conducted, and the first contact 142 and the second conductive member 152 in the third pixel region 103 are conducted.

In the embodiment, a potential of the pixel electrode 14 in the first pixel region 101 is the same as a potential of the pixel electrode 14 of the fourth pixel region 104, the first pixel region 101 can display the image of the fourth pixel region 104; a potential of the pixel electrode 14 in the second pixel region 102 is the same as a potential of the pixel electrode 14 of the third pixel region 103, the second pixel region 102 can display the image of the third pixel region 103, thereby improving the sensory experience after the pixel is repaired, furthermore, waste of subsequent target can be avoided, and the product yield is improved.

The embodiments of the present invention are described in detail above. Specific embodiments are used herein to describe the principles and implementation manners of the present invention. The description of the foregoing embodiments is merely used to help understand the method and core idea of the present invention. Meanwhile, that ordinary skill in the art, based on the idea of the present invention, may make some changes in the specific implementation manners and application scopes. To sum up, the contents of the present specification should not be construed as limiting the present invention.

What is claimed is:

1. An array substrate, comprising a plurality of gate lines, a plurality of data lines, a plurality of thin film transistors (TFTs), a plurality of pixel electrodes, and a plurality of conductive members, wherein the plurality of data lines and the plurality of gate lines are to cross each other to enclose a plurality of pixel regions, the plurality of conductive members are insulated from each other, and each of the conductive members of the plurality of conductive members corresponds to two adjacent pixel regions of the plurality of pixel regions;

in each of the pixel regions of the plurality of pixel regions, a control terminal of a respective TFT is electrically connected with a corresponding gate line of the plurality of gate lines, an input terminal of the respective TFT is electrically connected with a corresponding data line of the plurality of data lines, and an output terminal of the respective TFT is electrically connected with a corresponding pixel electrode of the plurality of pixel electrodes; the output terminal comprises a body, and a first contact and a second contact which are connected with the body, the first contact and one conductive member of the plurality of conductive members extending into a corresponding pixel region of the plurality of pixel regions are disposed to overlap each other and are insulated from each other, the second contact and another conductive member of the plurality of conductive members extending into the corresponding pixel region of the plurality of pixel regions are disposed to overlap each other and are insulated from each other.

2. The array substrate according to claim 1, wherein the plurality of conductive members are strip-shaped, and an extending direction of the plurality of conductive members is perpendicular to an extending direction of the plurality of data lines or the plurality of gate lines.

3. The array substrate according to claim 1, the array substrate further comprising a common electrode line insulated from the corresponding pixel electrode of the plurality of pixel electrodes to form a first storage capacitor, the common electrode line and the body are insulated from each other to form a second storage capacitor.

4. The array substrate according to claim 2, the array substrate further comprising a common electrode line insulated from the corresponding pixel electrode of the plurality of pixel electrodes to form a first storage capacitor, the common electrode line and the body are insulated from each other to form a second storage capacitor.

5. The array substrate according to claim 3, wherein the plurality of conductive members and the common electrode line are disposed in a same layer.

6. The array substrate according to claim 1, wherein the body, the first contact, and the second contact are a same material and disposed in a same layer, the body electrically connected with the corresponding pixel electrode of the plurality of pixel electrodes.

7. The array substrate according to claim 4, wherein the body, the first contact, and the second contact are a same material and disposed in a same layer, the body electrically connected with the corresponding pixel electrode of the plurality of pixel electrodes.

8. The array substrate according to claim 6, wherein the output terminal further comprises a second wiring and a third wiring, the second wiring is connected between the first contact and the body, and the third wiring is connected between the second contact and the body.

9. The array substrate according to claim 8, wherein the second wiring is stripe-shaped, the first contact is rectangular shaped and in an extending direction of the second wiring, a width of the first contact is greater than or equal to a width of the second wiring.

10. A display panel, comprising an array substrate, which comprises a plurality of gate lines, a plurality of data lines, a plurality of thin film transistors (TFTs), a plurality of pixel electrodes, and a plurality of conductive members, wherein the plurality of data lines and the plurality of gate lines are to cross each other to enclose a plurality of pixel regions, the plurality of conductive members are insulated from each other, and each of the conductive members of the plurality of conductive members corresponds to two adjacent pixel regions of the plurality of pixel regions;

in each of the pixel regions of the plurality of pixel regions, a control terminal of a respective TFT is electrically connected with a corresponding gate line of the plurality of gate lines, an input terminal of the respective TFT is electrically connected with a corresponding data line of the plurality of data lines, and an output terminal of the respective TFT is electrically connected with a corresponding pixel electrode of the plurality of pixel electrodes; the output terminal comprises a body, and a first contact and a second contact which are connected with the body, the first contact and one conductive member of the plurality of conductive members extending into a corresponding pixel region of the plurality of pixel regions are disposed to overlap each other and are insulated from each other, the second contact and another conductive member of the plurality of conductive members extending into the corresponding pixel region of the plurality of pixel regions are disposed to overlap each other and are insulated from each other.

11. The display panel according to claim 10, wherein the plurality of conductive members are strip-shaped, and an extending direction of the plurality of conductive members is perpendicular to an extending direction of the plurality of data lines or the plurality of gate lines.

12. The display panel according to claim 10, the array substrate further comprising a common electrode line insulated from the corresponding pixel electrode of the plurality of pixel electrodes to form a first storage capacitor, the common electrode line and the body are insulated from each other to form a second storage capacitor.

13. The display panel according to claim 11, the array substrate further comprising a common electrode line insulated from the corresponding pixel electrode of the plurality of pixel electrodes to form a first storage capacitor, the common electrode line and the body are insulated from each other to form a second storage capacitor.

14. The display panel according to claim 12, wherein the plurality of conductive members and the common electrode line are disposed in a same layer.

15. The display panel according to claim 10, wherein the body, the first contact, and the second contact are a same material and disposed in a same layer, the body electrically connected with the corresponding pixel electrode of the plurality of pixel electrodes.

16. The display panel according to claim 13, wherein the body, the first contact, and the second contact are a same material and disposed in a same layer, the body electrically connected with the corresponding pixel electrode of the plurality of pixel electrodes.

17. The display panel according to claim 15, wherein the output terminal further comprises a second wiring and a third wiring, the second wiring is connected between the first contact and the body, and the third wiring is connected between the second contact and the body.

18. The display panel according to claim 17, wherein the second wiring is stripe-shaped, the first contact is rectangular shaped and in an extending direction of the second wiring, a width of the first contact is greater than or equal to a width of the second wiring.

* * * * *